United States Patent
Hawke et al.

[11] Patent Number: 6,133,626
[45] Date of Patent: Oct. 17, 2000

[54] THREE DIMENSIONAL PACKAGING CONFIGURATION FOR MULTI-CHIP MODULE ASSEMBLY

[75] Inventors: Robert E. Hawke, Burlington; Atin J. Patel, Mississauga; Sukhminder S. Binapal; Charles Divita, both of Burlington; Lynn McNeil; Thomas G. Fletcher, both of Waterdown, all of Canada

[73] Assignee: Gennum Corporation, Burlington, Canada

[21] Appl. No.: 09/159,575

[22] Filed: Sep. 24, 1998

[51] Int. Cl.⁷ .................................................. H01L 23/02
[52] U.S. Cl. .................... 257/686; 257/685; 257/723; 257/724; 257/777; 257/778; 257/780; 438/108; 438/109; 361/729; 361/735; 361/743
[58] Field of Search ...................... 257/686, 685, 257/777, 778, 779, 780, 783, 784, 723, 724; 438/109, 108; 361/729, 735, 743

[56] References Cited

U.S. PATENT DOCUMENTS

| | | | |
|---|---|---|---|
| 4,706,166 | 11/1987 | Go | 361/403 |
| 5,128,831 | 7/1992 | Fox, III et al. | 361/396 |
| 5,138,438 | 8/1992 | Masayuki et al. | 357/75 |
| 5,222,014 | 6/1993 | Lin | 361/414 |
| 5,229,647 | 7/1993 | Gnadinger | 257/785 |
| 5,331,235 | 7/1994 | Chun | 257/777 |
| 5,422,435 | 6/1995 | Takiar et al. | 174/52.4 |
| 5,760,478 | 8/1999 | Bozso et al. | 257/777 |
| 5,790,384 | 8/1998 | Ahmad | 361/760 |

FOREIGN PATENT DOCUMENTS

| | | |
|---|---|---|
| 0 706220 | 4/1996 | European Pat. Off. . |
| 0 729180 | 8/1996 | European Pat. Off. . |
| 0782191 | 2/1997 | European Pat. Off. . |
| 0 782191 | 7/1997 | European Pat. Off. . |
| 2715771 | 8/1995 | France . |

OTHER PUBLICATIONS

"Method of Constructing a Central Processing Unit Using Light Communications", IBM Technical Disclosure Bulletin, vol. 33, No. 11, Jan. 4, 1991.

*Primary Examiner*—Tom Thomas
*Assistant Examiner*—Luan Thai
*Attorney, Agent, or Firm*—Bereskin & Parr

[57] ABSTRACT

A multi-chip module (MCM) assembly has three stacked integrated circuit (IC) layers. The first IC layer is electrically flip-chip connected to a substrate. The back of the second IC layer may be glued to the back of the first IC layer, and the second and third IC layers are electrically flip-chip connected to each other. In one embodiment, the third IC layer is electrically connected to the substrate through a vertical interconnect element for high circuit density. In another, the second IC layer is electrically connected to the substrate using wire bonding for greater post-fabrication customization flexibility. In still another embodiment, the MCM assembly comprises two stacked IC layers where the second IC layer is electrically flip-chip connected to the first IC layer and the second layer is electrically connected to the substrate through a vertical interconnect element. By directly connecting IC layers, higher circuit density, lower trace impedance, and lower cross-talk or electrical noise susceptibility is achieved over that presently offered by most current MCM assemblies. The assembly accommodates different sized IC layers, multiple ICs on each layer, and different technology-based IC layers and ICs within each layer, providing the user with high design flexibility within a single multi-chip assembly.

19 Claims, 10 Drawing Sheets

6,133,626

THREE DIMENSIONAL PACKAGING CONFIGURATION FOR MULTI-CHIP MODULE ASSEMBLY

FIELD OF THE INVENTION

The present invention relates to semiconductor packaging technology, and more particularly, to a packaging configuration for a three dimensional multi-chip module assembly.

BACKGROUND OF THE INVENTION

Most integrated circuits (ICs) are packaged in plastic or ceramic packages with extending metal leads for soldering to a printed circuit board (PCB) or for insertion into a socket. In most cases, a single package will only contain a single IC, although multiple chips are more commonly being manufactured within a single package. The use of such packages results in a low circuit density as the ceramic or plastic package consumes relatively large areas of the mounting surface, particularly if a socket is used.

Multi-chip module (MCM) technology has been developed to suit applications where it is necessary to reduce the size of the assembly or where speed or electrical noise considerations require shorter connecting leads. A typical MCM package combines a number of individual or unpackaged integrated circuits and directly attaches them to the mounting surface, for example ceramic substrate, PCB or other substrate. ICs within MCM assemblies can be electrically connected using various bonding techniques such as solder, wire bonding, tape automated bonding (TAB), and flip-chip technologies.

Many MCM assemblies are constructed in a two dimensional array to reduce the associated surface area required if the individual packaged devices were mounted on electronic circuit boards. More sophisticated MCM techniques employ three-dimensional IC layer stacking to achieve higher circuit density by further reducing the volume of interconnections. The principle drawback of most existing three dimensional MCM assembly configurations is that they interconnect vertically stacked IC layers using common carriers or conductors which typically extend vertically and/or horizontally from the stacked IC layers.

The presence of these common carriers within the MCM package significantly reduces the volumetric efficiency of the overall assembly. Further, the presence of common carriers lengthens the signal path between the circuit layers, which increases trace impedances. Such impedances can adversely affect analog circuit gain and give rise to improper RC time constants for digital circuits. Finally, the longer signal path may create stray cross-talk and electrical noise for high frequency MCM applications.

Reference is made to FIGS. 1a to 1e, which show cross sectional side views of various conventional three dimensional MCM prior art assemblies that employ well known electrical connection techniques. The figures consist of diagrammatic representations excerpted from "Three Dimensional Electronics Packaging", a multi-client study by TechSearch International, Inc. 1993. Common elements between the various MCM assemblies will be denoted by the same numerals and new features will be denoted by new numbers where appropriate.

FIG. 1a illustrates the use of well-known TAB techniques to connect four unpackaged identically sized ICs 10 to each other as well as to a PCB 12. This type of MCM assembly is described in U.S. Pat. No. 5,138,438 issued Aug. 11, 1992 to Masayuki et al., which provides an MCM assembly for memory application using TAB technology to electrically connect stacked identically sized ICs.

TAB technology is a process which joins unpackaged ICs using patterned metal on polymeric tape, applied to the ICs using any of various bonding techniques including thermocompression, thermosonic, laser or pulsed reflow bonding. A laminated tape of gold-plated copper foil acts as a carrier vehicle for semiconductor chips. The foil, etched in the form of leads, is bonded to metallurgical bumps on the chip pads, after which the chip and the attached leads are excised from the tape and bonded to the substrate.

Specifically, identically sized ICs 10 are laterally arranged in parallel and connected to each other and to PCB 12 through the bonding of inner leads of TAB tapes 14 to bonding bumps 16 provided at the pad portions of ICs 10. The TAB leads which both extend vertically between ICs 10 and horizontally over PCB 12, are combined into a small outline package (SOP) which occupies significant device volume. Further, this MCM assembly is only applicable to identically sized ICs and can suffer from electrical noise at high frequency operation due to its TAB leads.

FIG. 1b shows another MCM assembly which electrically connects stacked and identically sized ICs 10 to substrate 18 on a common access plane. This assembly method is described in U.S. Pat. No. 4,706,166, issued on Nov. 10, 1987 to Go, and uses well-known flip-chip technology.

Flip-chip technology allows for the electrical and mechanical connection of a chip to a substrate by inverting and bonding the chip face down to the substrate interconnection pattern. A raised metallic bonding bump is made on each of the chip mounting pads, the bonding bumps corresponding to the conductive land areas on the substrate. The bonding bumps are joined to the conductors on the substrate and bonding is completed using controlled reflow solder techniques or conductive epoxy attachment.

Flip-chip mounting is space and cost efficient because the direct connection between IC layers minimize the area normally taken up by the interconnections between IC layers, and because the technique accomplishes all connections concurrently instead of serially as with wire bonding. Another advantage of this technique is that electrical parasitics are significantly decreased due to short electrical length of the contacts.

U.S. Pat. No. 4,706,166 shows a memory assembly which adhesively binds ICs 10 together and which has exposed leads along an access plane defined by line A. Bonding bumps 16 are formed on the access plane as well as on substrate 18. Both sets of bonding bumps are aligned and bonded together under heat and/or pressure. The MCM is then wire bonded in a housing for external connection. While the device uses space efficient flip-chip connections, the access edge substrate layer and device housing decreases the volume efficiency of the assembly. Edge bonding techniques are relatively costly and only same size ICs can be accommodated by the device.

FIG. 1c shows another flip-chip based MCM assembly, which electrically connects stacked identical IC layers 10 using metal connections within assembly spacers. This type of MCM assembly is exemplified by U.S. Pat. No. 5,128,831, issued on Jul. 7, 1992 to Fox et al. where ICs 10 are all flip-chip bonded to substrates 18. Supporting spacers 20 are positioned between substrates 18 and contain appropriately placed vias 22 that may be connected electrically with substrate vias 24. The package is then placed in a solder bath to fill vias 22 and 24 with molten solder. This type of MCM assembly still requires the use of spacers which appreciably increase the vertical and horizontal dimension of the assembly and thus the overall device volume.

FIG. 1d shows a typical ball grid array MCM as exemplified by U.S. Pat. No. 5,222,014 issued Jun. 22, 1993 to Lin. One IC layer 10 and its carrier substrate 18 is electrically connected to a second IC layer 10' and its carrier substrate 18' using reflowable solder balls 26 which are pre-bumped onto the appropriate surfaces of substrates 18 and 18'. Electrical connections between IC layers 10 and 10' and their respective substrates 18 and 18' are made using conventional wire bonding wires 28 and flip-chip bonding. Interconnections between IC layers 10 and 10' are achieved through vias interconnects 30 and solder balls 26. While each substrate is capable of carrying multiple chips and different sized ICs may be used within the MCM, the device employs volume consuming carrier substrates 18 and 18' and solder balls 26 and encounters noise at high frequency operation.

FIG. 1e shows an MCM assembly with metal-filled through-hole vias, a typical application of which is discussed in U.S. Pat. No. 5,229,647 issued Jul. 20, 1993 to Gnadinger. Vertical interconnection between one silicon wafer 32 and another silicon wafer 32' is achieved using metal-filled through-hole vias 34 and 34' to contact bumps 36 and 36' on adjacent wafers. Although this is an efficient wafer connection method, individual ICs from different manufacturers cannot be used. Further, the device is mounted in a housing which significantly reduces the silicon density of the device.

BRIEF SUMMARY OF THE INVENTION

It is therefore an object of the present invention to provide a configuration for achieving improved packaging density and for reducing trace impedances and operational cross-talk or electrical noise for variably sized stacked ICs. In a first aspect the invention provides an MCM assembly comprising:

(a) a substrate having a conductive surface facing in a first direction, (b) a first integrated circuit (IC) layer having a conductive surface facing in a second direction opposite to said first direction, towards said conductive surface of said substrate, said conductive surface of said first IC layer being electrically connected to said conductive surface of said substrate, (c) a second IC layer positioned over said first IC layer, said second IC layer having a conductive surface facing in said first direction, and (d) a third IC layer having a conductive surface facing in said second direction, said third IC layer being positioned at least in part over the second integrated circuit layer, the conductive surface of said third IC layer being electrically connected to said conductive surface of said second IC layer.

In another aspect, the invention provides an MCM assembly comprising:

(a) a substrate having a conductive surface facing in a first direction, (b) a first integrated circuit (IC) layer positioned over said substrate, having a conductive surface facing in said first direction, (c) a second IC layer positioned over said first IC layer, having a conductive surface facing in a second direction opposite to said first direction, said second IC layer extending beyond said first IC layer to define an overhanging portion, the conductive surface of said second IC layer being electrically flip-chip connected to said conductive surface of said first IC layer, (d) an interconnect member extending between said overhanging portion and said conductive surface of said substrate, being electrically flip-chip connected to said overhanging portion and electrically flip-chip connected to said conductive surface of said substrate.

In still another aspect, the invention provides an MCM assembly comprising:

(a) a substrate having a conductive surface facing in a first direction, (b) a first integrated circuit (IC) layer positioned over said substrate, having a conductive surface facing in said first direction, (c) a second IC layer positioned over said first IC layer, having a conductive surface facing in a second direction opposite to said first direction, wherein a portion of said conductive surface of said second IC layer is positioned over said conductive surface of said substrate without said first IC layer being between said portion and said conductive surface of said substrate, the conductive surface of said second IC layer being electrically flip-chip connected to said conductive surface of said first IC layer, (d) an interconnect member extending between said portion and said conductive surface of said substrate, being electrically flip-chip connected to said portion and electrically flip-chip connected to said conductive surface of said substrate.

Further objects and advantages of the invention will appear from the following description, taken together with the accompanying drawings.

DETAILED DESCRIPTION OF PREFERRED EMBODIMENTS

Figure 1A:
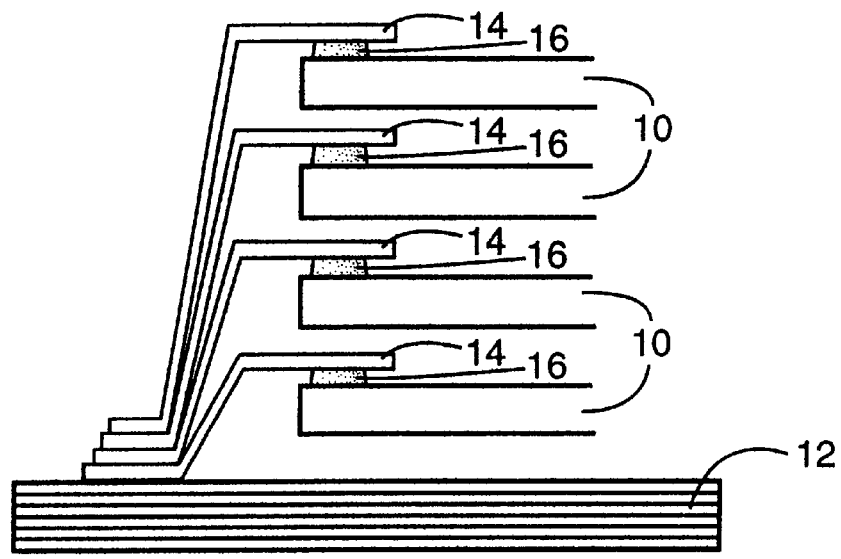
FIG. 1a is a diagrammatic side sectional view of a prior art TAB bonded MCM assembly.
Figure 1B:
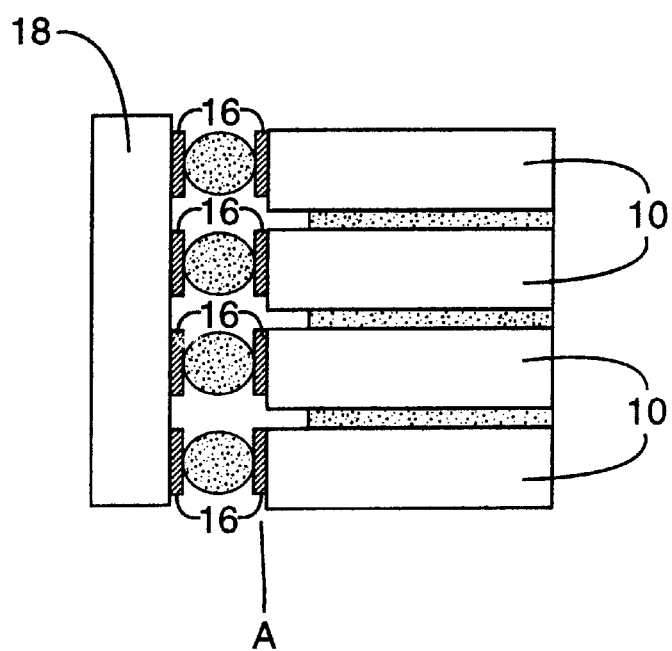
FIG. 1b is a diagrammatic side sectional view of a prior art flip-chip bonded MCM assembly.
Figure 1C:
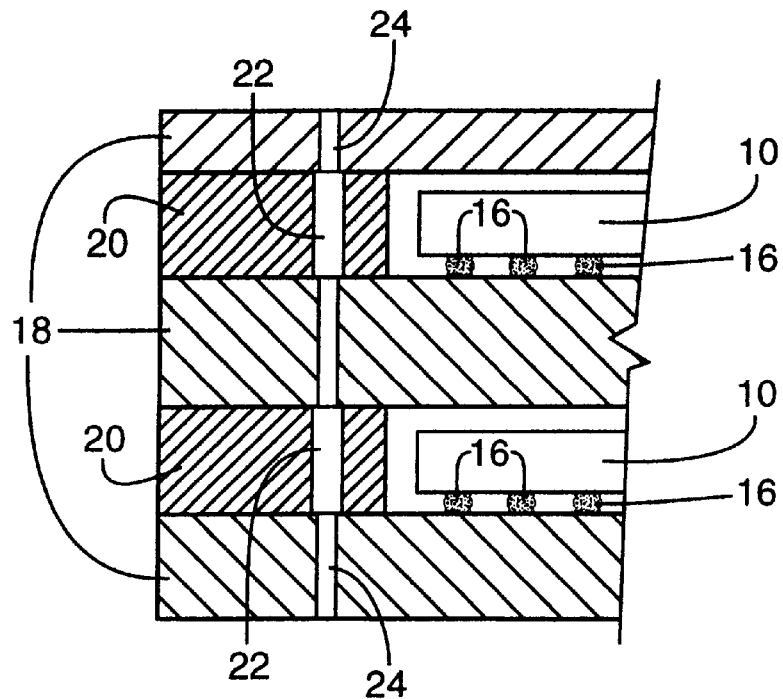
FIG. 1c is a diagrammatic side sectional view of another type of a prior art flip-chip bonded MCM assembly.
Figure 1D:
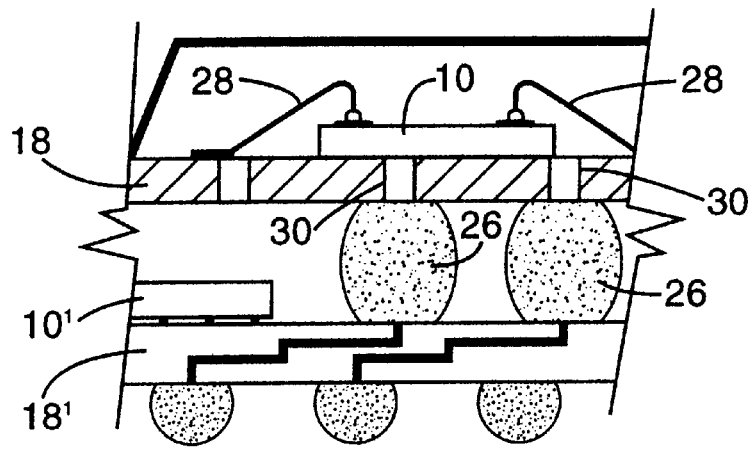
FIG. 1d is a diagrammatic side sectional view of a prior art ball grid array MCM assembly.
Figure 1E:
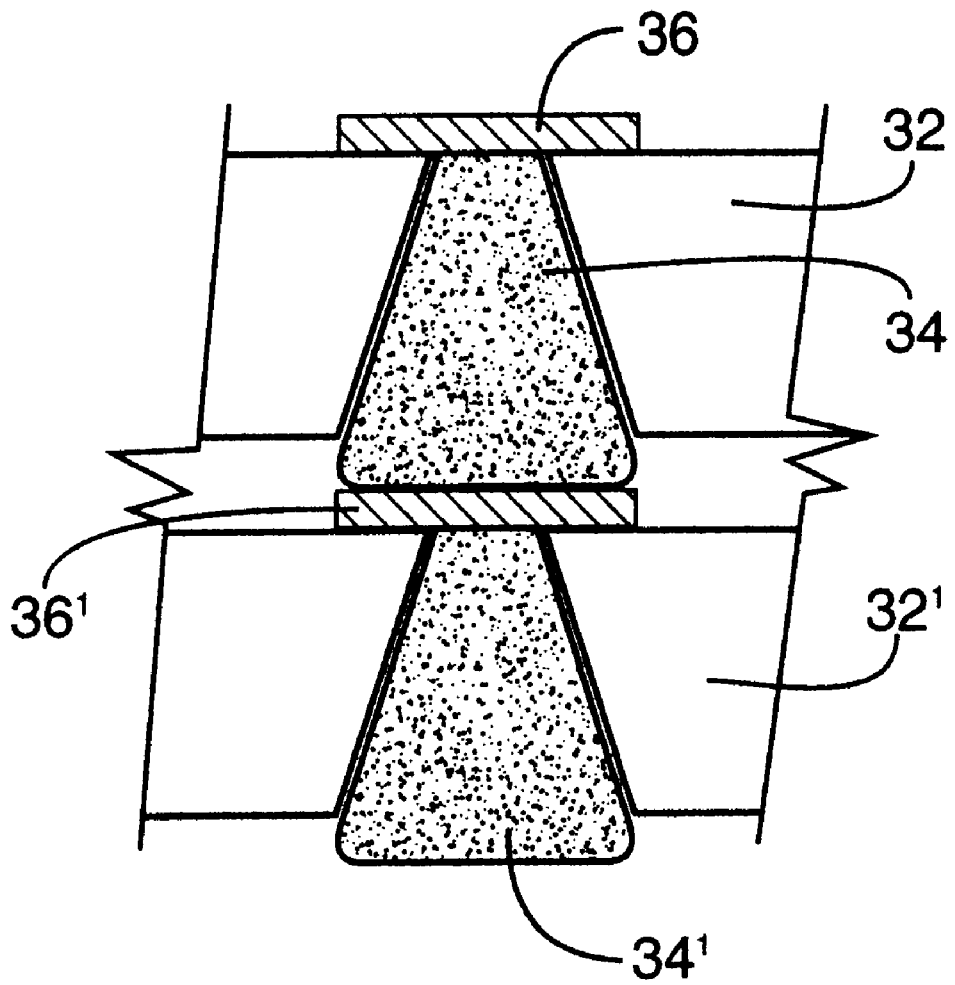
FIG. 1e is a diagrammatic side sectional view of a prior art metal through-hole vias MCM assembly.
Figure 2:
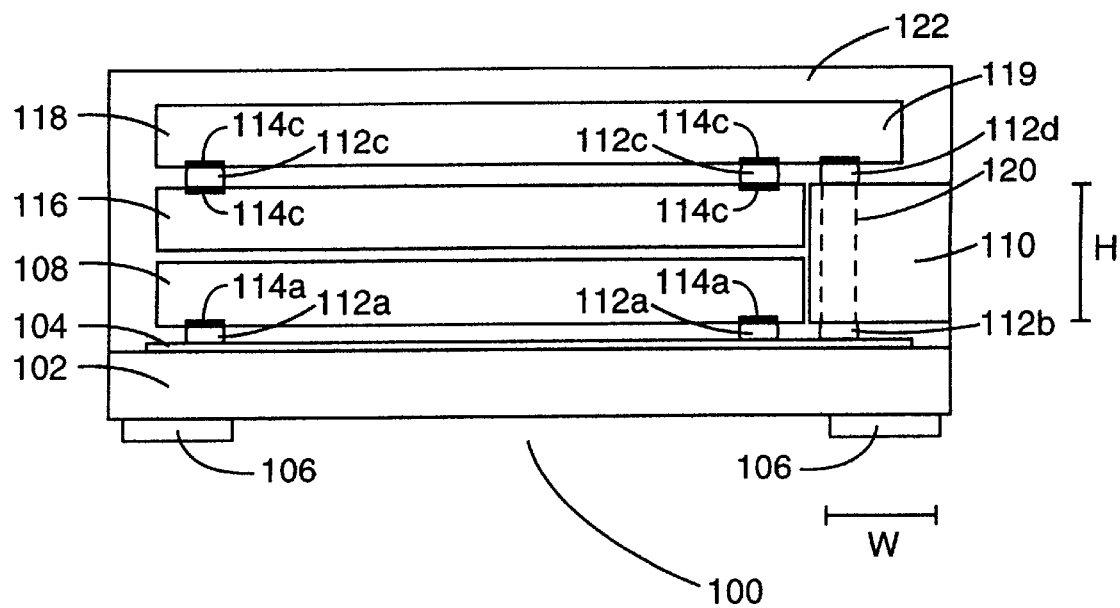
FIG. 2 is a diagrammatic side sectional side view of an MCM assembly according to the present invention where the third integrated circuit layer is electrically connected to the substrate layer using a vertical interconnect element.
Figure 3:
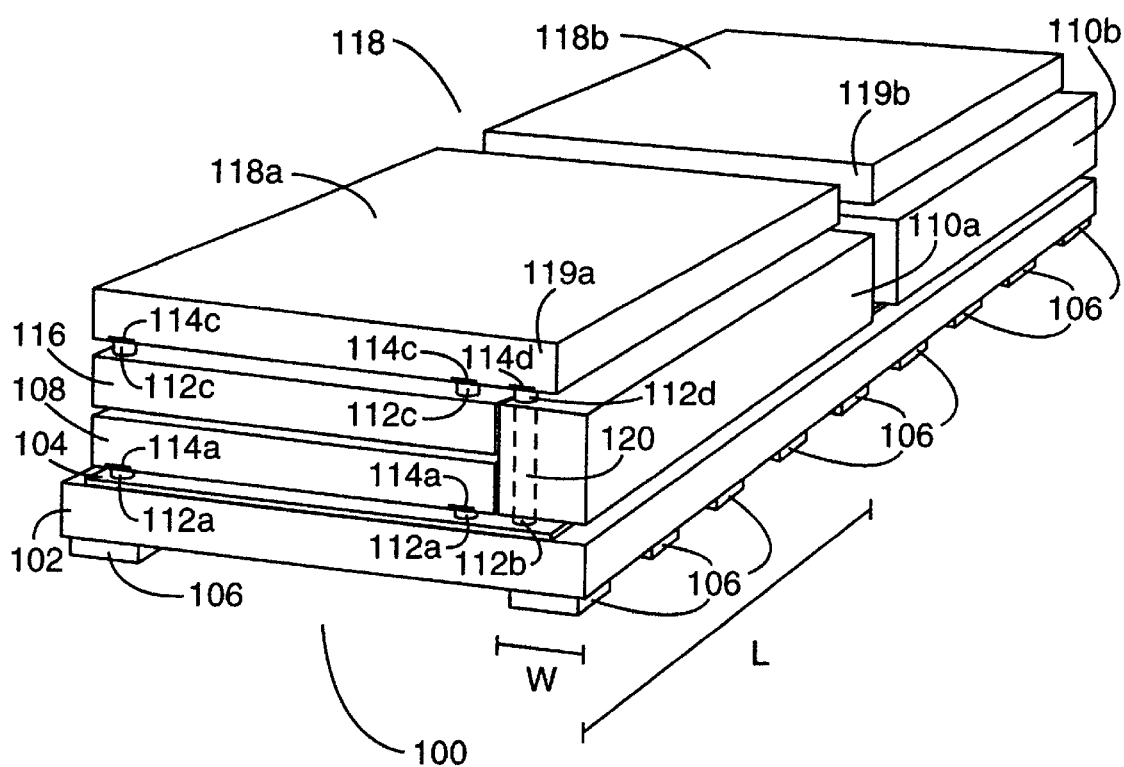
FIG. 3 is an isometric perspective view of the MCM assembly of FIG. 2.

Reference is first made to FIGS. 2 and 3, which show a multi-chip module (MCM) assembly 100, made in accordance with a preferred embodiment of the invention.

MCM assembly 100 includes a conventional substrate 102 formed of alumina as used in the manufacture of thick or thin film hybrids, or polyamide as used in flex circuitry applications, or glass-epoxy composites such as FR4 used in rigid circuit boards, or any other suitable material. Substrate 102 has a typical thickness of 0.254 mm but may range in thickness, e.g. from 76.2 µm to 0.508 mm.

Substrate 102 is covered by one or more metal interconnect layers 104, formed of any suitable metal (e.g. gold, copper, platinum or palladium). MCM mounting pads 106 are shown on the underside of substrate 102 and are used to electrically connect and mechanically attach the MCM assembly 100 to peripheral circuitry. Metal interconnect 104 provides electrical connection to the conductive areas present on substrate 102. Finally, substrate 102 has conducting through holes or vias (not shown) formed through the substrate from its top surface (where they are connected to metal interconnect 104) to its bottom surface (where they are connected to pads 106 or additional metal interconnect).

Positioned above metal interconnect 104 is a first IC layer 108 and a vertical interconnect element 110.

First IC layer 108 is flip-chip connected to metal interconnect 104 through flip-chip joints 112a. Flip-chip joints 112a, or raised metallic bumps, are formed on mounting pads 114a of first IC layer 108 and bonded to metal interconnect 104 using a conductive interconnect material such as solder or conductive epoxy. As a result, the required conductive surface areas of first IC layer 108 are directly connected electrically and mechanically to the conductive surface areas of substrate 102.

Figure 2A:
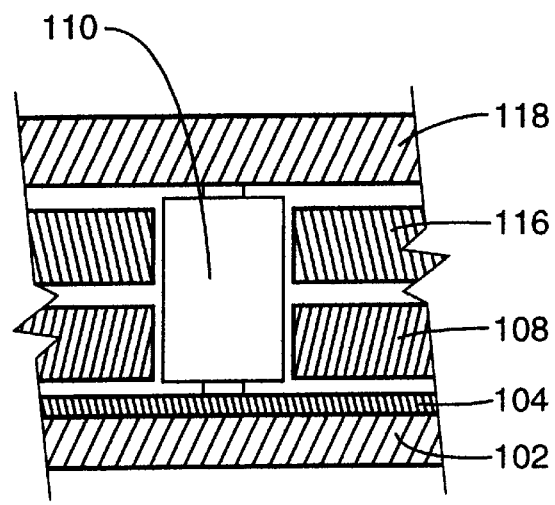
FIG. 2a is a diagrammatic side sectional view of an MCM assembly according to the present invention where the third integrated circuit layer extends over the vertical interconnect and first and second integrated circuit layers are arranged around the side surfaces of the vertical interconnect.

Vertical interconnect element 110 is also flip-chip connected to metal interconnect 104 through flip-chip joints 112b formed on the conductive areas of vertical interconnect element 110 and joined to the appropriate conductive areas of substrate 102. Vertical interconnect element 110 is shown positioned over metal interconnect 104 on the side edge of MCM assembly 100. However, it should be understood that vertical interconnect element 110 can alternatively be positioned at any location over metal interconnect 104 such that vertical interconnect 110 is electrically connected to third IC layer 118 and metal interconnect 104. As an illustration, vertical interconnect 110 could alternatively be located in the centre of MCM assembly 100 such that third IC layer 118 extends over vertical interconnect 110, first and second IC layers 108 and 116 are arranged around the side surfaces of vertical interconnect 110 (each having in effect a hole through which vertical interconnect 110 extends), and metal interconnect 104 extends under the bottom surface of vertical interconnect 110. This is shown in FIG. 2a.

Positioned above first IC layer 108 is a second IC layer 116, not electrically connected directly to first IC layer 108.

Third IC layer 118 is positioned above second IC layer 116 and is flip-chip connected to second IC layer 116 through flip-chip joints 112c formed on mounting pads 114c on second and third IC layers 116 and 118. Third IC layer 118 is also flip-chip connected to vertical interconnect element 110 through flip-chip joints 112d formed on mounting pads 114d on third IC layer 118 and bonded to conductive areas of vertical interconnect element 110. Third IC layer 118 is designed to overhang first and second IC layers 108 and 116 (having an overhanging portion 119) such that the overhanging portion 119 of third IC layer 118 sufficiently extends over the top surface of vertical interconnect element 110 in order for third IC layer 118 to make electrical contact with vertical interconnect element 110.

Vertical interconnect element 110 is an electrically interconnecting element fabricated using conventional substrate manufacturing techniques. Vertical interconnect element 110 is formed of similar material as the substrate (ie. alumina, glass epoxy or polyamide) and has top and bottom surfaces which contain matched conductor patterns. Further, electrical conductors 120 electrically connect the top conductor patterns with the bottom conductor patterns. In this way, vertical interconnect element 110 electrically interconnects conductive areas of third IC layer 118 to conductive areas of substrate 102.

It should be noted that in FIGS. 2 and 3, the thicknesses of the IC layers are much exaggerated. The IC layers 108, 116 and 118 and vertical interconnect element 110 have approximate thicknesses of 0.254 mm but may range in thickness, e.g. from 76.2 µm to 0.508 mm. Vertical interconnect element 110 typically has an approximate width W of 0.254 mm, a length L required to place on it the required number of electrical connections, and height H equivalent to the combined thickness of first and second IC layers 108 and 116. These dimensions are illustrative and are not intended to be limiting.

After the MCM assembly 100 is formed, it may then covered with a layer of suitable encapsulant 122, so that all elements are completely covered. Encapsulant 122 may form a rigid coating to protect the assembly from environmental corrosion, light and mechanical damage. Encapsulant 122 and substrate 102 are then cut to final size within approximately 0.127 mm from the edge of the IC layers 114, 116 and 118 and vertical interconnect element 110 to form a finished packaged MCM assembly 100. It has been determined that an MCM assembly 100 can be fabricated with (for example) a size as small as about 1.78 mm in length and width and a maximum size limited only by the ability to encapsulate under and in between the ICs to provide sufficient mechanical stability to the flip-chip connections.

It should be noted that due to the MCM assembly's lack of peripheral interconnection apparatus, such as external TABs, wire bonds or edge mounted carriers, the area and volume of the final MCM assembly 100 is substantially minimized. By directly attaching two IC layers to each other and by attaching the remaining IC layer to the substrate, conventional peripheral interconnections between IC layers are no longer required. An extremely high silicon package density as well as a significantly reduced electronic noise susceptibility is achieved by the present invention.

Further volumetric efficiencies are attained due to the fact that MCM assembly 100 does not require an external protective housing as it is particularly suited for direct attachment of auxiliary electrical components.

Referring specifically to FIG. 3, another view of the MCM assembly 100 is shown without the encapsulant layer 122. Third IC layer 118 is shown to comprise two distinct ICs 118a and 118b with two overhanging portions 119a and 119b. Vertical interconnect element 110 is shown to comprise two separate vertical interconnect elements 110a and 110b. FIG. 3 shows the side positions of various MCM mounting pads 106 on the underside of substrate 102, used for electrical connection to various peripheral elements.

IC 118a and IC 118b are positioned above second IC layer 116 and are flip-chip connected to second IC layer 116 through flip-chip joints 112c formed on mounting pads 114c on second IC layer 116 and ICs 118a and 118b. ICs 118a and 118b are flip-chip connected to vertical interconnect elements 110a and 110b through flip-chip joints 112d formed on mounting pads 114d on ICs 118a and 118b and bonded to conductive areas of vertical interconnect elements 110a and 110b. ICs 118a and 118b sufficiently overhang first and second IC layers 108 and 116 such that ICs 118a and 118b extend over the top surface of vertical interconnect elements 110a and 110b.

It is evident from FIGS. 2 and 3 that since vertical interconnect element 110 is of such narrow dimension, MCM assembly 110 attains an extremely high packaging density. Direct IC connections between first IC layer 108 and substrate 102 and second and third IC layers 116 and 118 eliminate the need for space exhaustive carrier interconnections.

Further, due to the assembly's geometry, differently sized IC layers may be accommodated and further, an unlimited number of separate ICs may be contained on each IC layer, subject only to physical dimensions of the layer itself and the electronic limitations of the circuits themselves.

It is also possible to configure MCM assembly 100 such that each IC layer or IC may be independently based on either digital, analog or passive technology. In this way, different technologies can be combined within a single MCM assembly 100. Indeed, various technology ICs can be included in the chips forming each layer.

Most research relating to stacked MCM devices has to date been confined to memory applications and as result, very few mixed technology MCMs are currently available. Although silicon techniques such as BICMOS allow for the integration of bipolar and CMOS technology on a single chip, such techniques are extremely complex and costly. Since greater functionality is incorporated into a single chip, the individual chip size is increased. Defects on integrated circuit wafers are randomly distributed. Since a single defect causes an entire IC to be discarded, and larger devices translate to fewer ICs per wafer, the effective device yield is reduced over using multiple small ICs.

A major advantage to the process of creating a stacked MCM of the kind described is that each IC layer can be fabricated and tested prior to assembling the module. Thus, ICs of various technologies (and of various manufacturers) can be separately fabricated and tested prior to combination into a whole MCM device, reducing the likelihood of costly rejects and the need for redundant IC sets. Accordingly, the present invention allows for the manufacture of cost effective MCMs containing ICs of different technologies. Thus, MCM assembly 100 provides the user with a high degree of design flexibility by allowing the use of variously sized IC layers, multiple ICs within each IC layer and combinations of different technology ICs within the device.

Finally, due to the significantly shorter signal path of flip-chip joints, the present invention provides a configuration for achieving lower trace impedances and reducing operational cross-talk or electrical noise susceptibility at high frequencies than previously attainable in conventional three dimensional MCM assemblies.

Accordingly, MCM assembly 100 provides the user with a highly space efficient, noise resistant, cost efficient, and flexibly designable MCM assembly.

Figure 4:
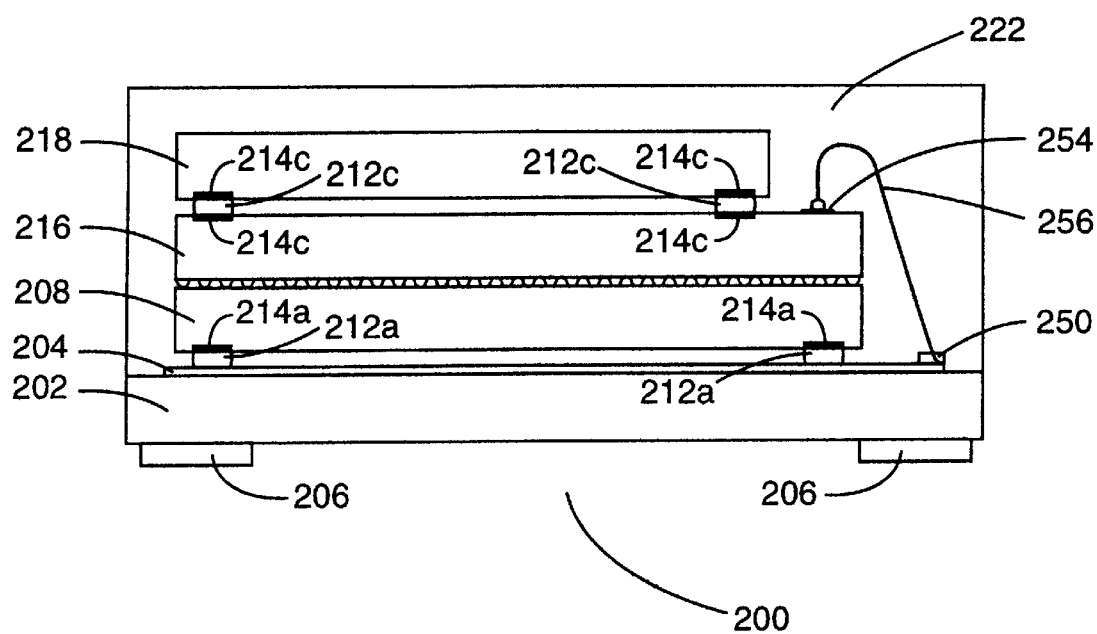
FIG. 4 is a diagrammatic side sectional view of another embodiment of an MCM assembly according to the invention, in which the second integrated circuit layer is electrically connected to the substrate layer using wire bonding techniques.
Figure 5:
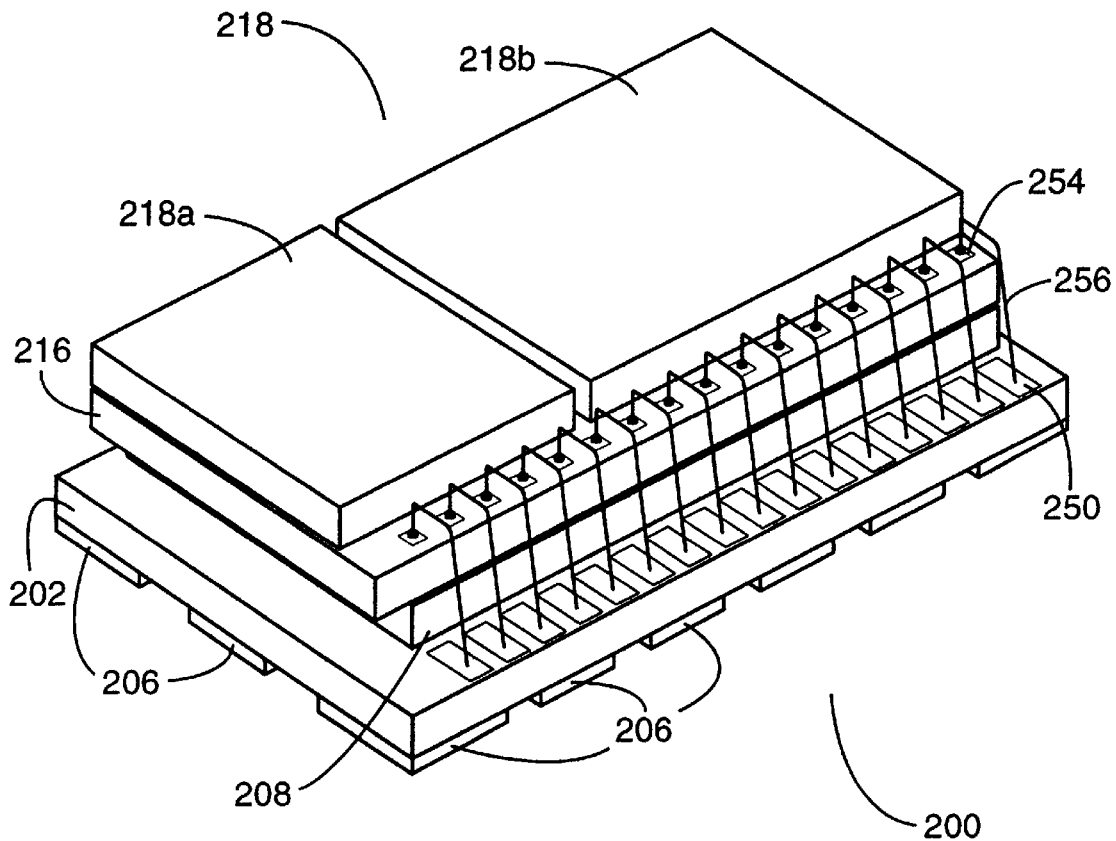
FIG. 5 is an isometric perspective view of the MCM assembly of FIG. 4.

Reference is next made to FIGS. 4 and 5, which show an alternative wire bonded embodiment of the MCM assembly 200 of the present invention which utilizes wire bonding technology in addition to flip-chip technology to interconnect device elements.

Conventional multi-chip assemblies tend to rely on only one kind of connection technology, such as TAB or flip-chip technology for IC layer interconnection. MCM assembly 200 utilizes wire bonding and flip-chip connection technology to connect various IC layers to each other as well as to the substrate of an MCM structure. The resulting assembly provides the desirable advantage of post-fabrication device customization by simple changes to the wire bond configuration.

Common elements between the alternative MCM assembly 200 embodiment and the MCM assembly 100 will be denoted by the same numerals but with one hundred added thereto.

MCM assembly 200 includes substrate 202 covered by a metal interconnect 204, both formed of materials previously described. MCM mounting pads 206 on the underside of substrate 202 are used to electrically connect MCM assembly 200 to peripheral circuitry. The upper surface of substrate 202 also includes conductive landing pads 250 (FIG. 5) adjacent its edge, to allow for interconnection with IC layers stacked above as will be described. A first IC layer 208 is positioned above the metal interconnect 204 and is flip-chip connected to metal interconnect 204 through flip-chip joints 212a as previously described.

Positioned above first IC layer 208 is second IC layer 216 which is adhesively attached to the back of first IC layer 208 using a conventional die attach adhesive 252. The upper surface of second IC layer 216 has interconnect points 254 located adjacent its outside edge (FIG. 5). Interconnect points 254 are bonded to one end of fine wires 256 of appropriate material (e.g. gold, aluminum, etc.) with approximate diameter of (e.g.) 25.4 μm. The other ends of wires 256 are bonded to conductive landing pads 250 of substrate 202. This is achieved by conventional wire bonding techniques.

Third IC layer 218 is positioned above second IC layer 216 and is flip-chip connected to second IC layer 216 through flip-chip joints 212c formed on mounting pads 214c on second and third IC layers 216 and 218. Third IC layer 218 is of a smaller horizontal dimension than second IC layer 216, to leave one or more edges of second IC layer 216 uncovered and hence to allow interconnect points 254 of second IC layer 216 to be freely accessed for wire bonding interconnection purposes.

After assembly, the entire MCM assembly 200 may be covered with a layer of conformal encapsulant 222 as previously described. Encapsulant 222 and substrate 202 are then cut to final size within approximately 0.127 mm from the edge of the IC layers 214, 216 and 218 and wire bonds to form a finished packaged MCM assembly 200. It has been determined that an MCM assembly 200 can fabricated with (for example) a size as small as about 1.78 mm in length and width and a maximum size limited only by the ability to encapsulate under and in between the ICs to provide sufficient mechanical stability to the flip-chip and wire bond connections.

Referring specifically to FIG. 5, an MCM assembly 200 is shown without the encapsulant layer 222. Third IC layer 218 is shown to comprise two distinct ICs 218a and 218b.

IC 218a and IC 218b are positioned above second IC layer 216 and are flip-chip connected to second IC layer 216 through flip-chip joints 212c formed on mounting pads 214c on second IC layer 216 and ICs 218a and 218b.

While the circuitry volume of the final MCM assembly 200 is high, it is not as high as was the case for MCM assembly 100 due to the space required for the wire interconnects of MCM assembly 200. However, the use of wire bonding allows MCM assembly 200 to be suitably customized after fabrication of the unit. Such post-fabrication flexibility is highly desirable in applications which require ready customization capabilities, such as in the hearing aid field.

As with MCM assembly 100, MCM assembly 200 has the ability to incorporate different sized IC layers and/or an unlimited number of distinct ICs on each IC layer, subject only to physical dimensions of the layer itself and the electronic limitations of the circuits themselves. As with MCM assembly 100, it is also possible to configure MCM assembly 200 such that each IC layer IC may be independently based on either digital, analog or passive technology. Finally, MCM assembly 200 also provides a configuration for achieving lower trace resistances and operational crosstalk or electrical noise susceptibility at high frequencies.

Accordingly, MCM assembly 200 provides the user with a post-fabrication customizable, space efficient, noise resistant, cost efficient, and flexibly designable MCM device.

It should be understood that the configurations of MCM assemblies 100 and 200 can be combined into one device package. That is, one device package can have IC layers electrically connected to each other and to a substrate using a combination of the vertical interconnect and wire bonding configurations of MCM assemblies 100 and 200.

Figure 6:
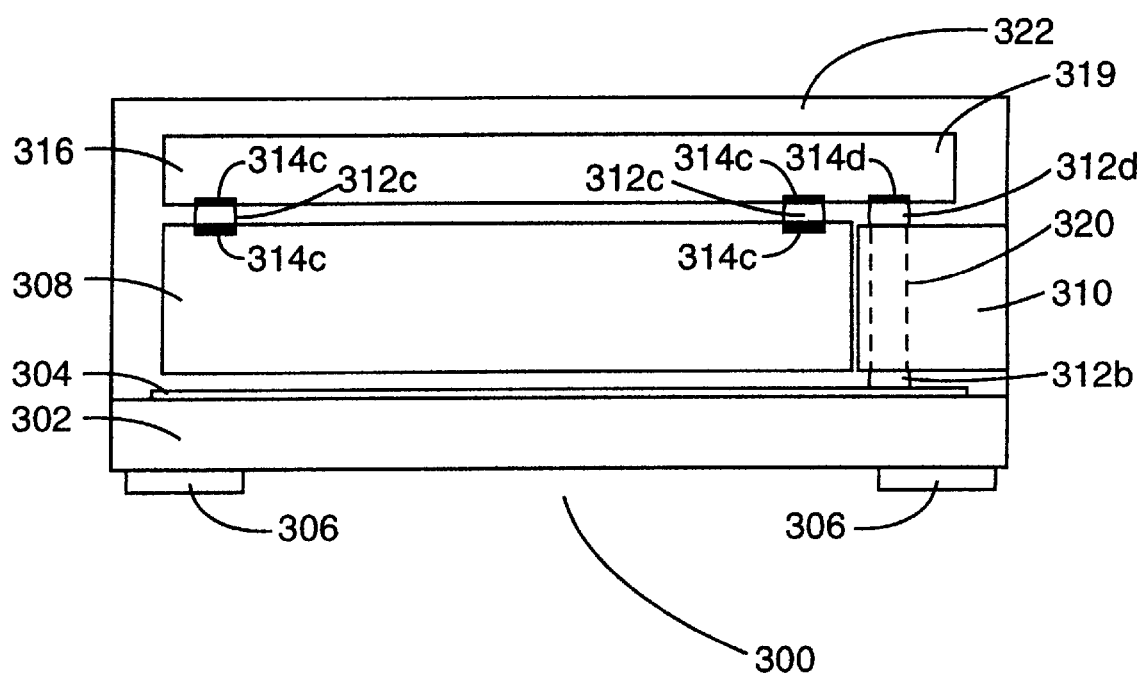
FIG. 6 is a diagrammatic side sectional view of another embodiment of an MCM assembly according to the invention, in which a second integrated circuit layer is electrically connected to the substrate layer using a vertical interconnect element.
Figure 7:
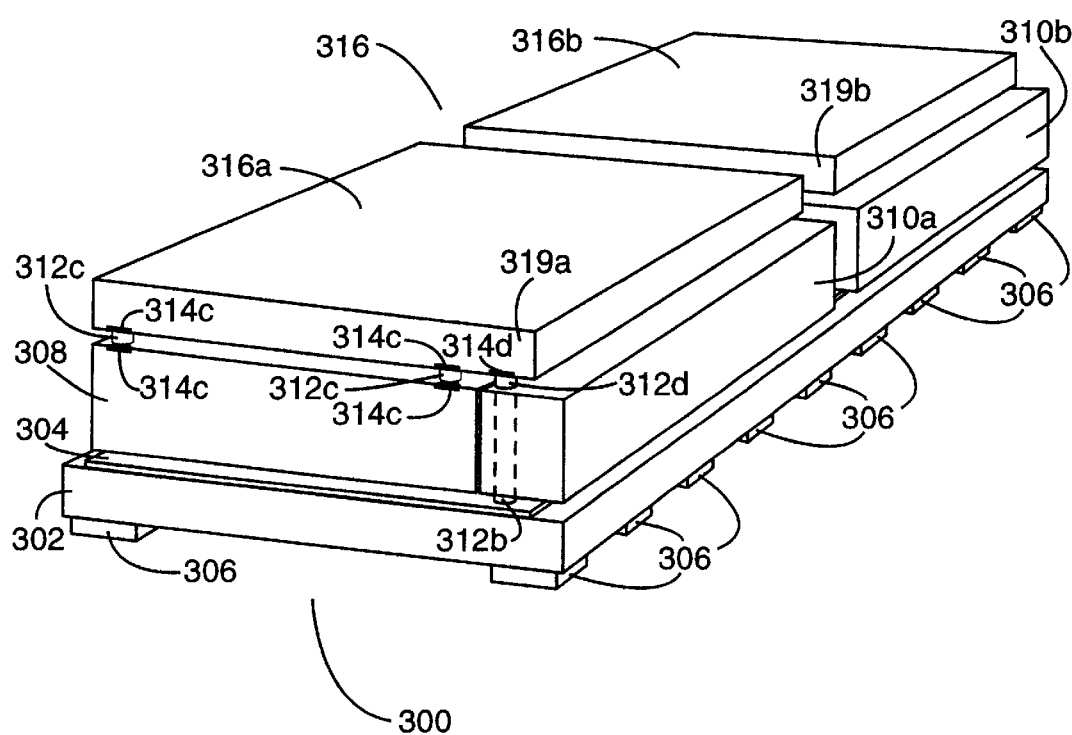
FIG. 7 is an isometric perspective view of the MCM assembly of FIG. 6.

Reference is next made to FIGS. 6 and 7, which show a alternative two layer MCM assembly 300 which utilizes flip-chip technology to interconnect two IC device layers to a substrate. Common elements between alternative embodiment MCM assembly 300 and MCM assembly 100 will be denoted by the same numerals but with two hundred added thereto.

MCM assembly 300 includes substrate 302 covered by a metal interconnect 304, both formed of materials previously described. MCM mounting pads 306 on the underside of substrate 302 are used to electrically connect MCM assembly 300 to peripheral circuitry.

Positioned above metal interconnect 304 is a first IC layer 308 and a vertical interconnect element 310.

First IC layer 308 is not directly electrically connected to substrate 302 and has its conductive surface facing upwards. Positioned above first IC layer 308 is a second IC layer 316, which is flip-chip connected to first IC layer 308 through flip-chip joints 312c formed on mounting pads 314c on first and second IC layers 308 and 316.

Vertical interconnect element 310 is flip-chip connected to metal interconnect 304 through flip-chip joints 312b formed on the conductive areas of vertical interconnect element 310 and joined to the appropriate conductive areas of substrate 302. As previously described, electrical conductors 320 electrically connect the top conductive patterns with the bottom conductive patterns of vertical interconnect element 310, so that the conductive areas of second IC layer 316 are electrically connected to conductive areas of substrate 302. As in the case of MCM assembly 100, it should be understood that vertical interconnect 310 can be positioned at any location over metal interconnect 304 such that the conductive areas of second IC layer 316 can be electrically connected to conductive areas of substrate 302 by vertical interconnect 310.

Second IC layer 316 is also flip-chip connected to vertical interconnect element 310 through flip-chip joints 312d formed on mounting pads 314d on second IC layer 316 and bonded to conductive areas of vertical interconnect element 310. Second IC layer 316 is designed to overhang first IC layer 308 (having an overhanging portion 319) such that the overhanging portion 319 of second IC layer 316 sufficiently extends over the top surface of vertical interconnect element 310 in order for second IC layer 316 to make electrical contact with vertical interconnect element 310.

Again, as in FIGS. 2 and 3, it should be noted that the thicknesses of the IC layers as represented in FIGS. 6 and 7 are much exaggerated. Further, the relative thicknesses of first IC layer 308 and second IC layer 316 may vary according from those represented therein.

After assembly, the entire MCM assembly 300 may be covered with a layer of conformal encapsulant 322 as previously described. Encapsulant 322 and substrate 302 are then cut to final size within approximately 0.127 mm from the edge of the IC layers 308 and 316 to form a finished packaged MCM assembly 300. It has been determined that an MCM assembly 300 can be fabricated with (for example) a size as small as about 1.78 mm in length and width and a maximum size limited only by the ability to encapsulate under and in between the two IC layers.

Again, due to the MCM assembly's lack of peripheral interconnection apparatus, such as external TABs, wire bonds or edge mounted carriers, the area and volume of the final MCM assembly 300 is substantially minimized. By directly attaching two IC layers to each other, conventional peripheral interconnections between IC layers are no longer required. An extremely high silicon package density as well as a significantly reduced electronic noise susceptibility is again achieved by this embodiment of the present invention.

Further volumetric efficiencies are attained due to the fact that MCM assembly 300 does not require an external protective housing as it is particularly suited for direct attachment of auxiliary electrical components.

Referring specifically to FIG. 7, another view of the MCM assembly 300 is shown without the encapsulant layer 322. Second IC layer 316 is shown to comprise two distinct ICs 316a and 316b with overhanging portions 319a and 319b. Vertical interconnect element 310 is shown to comprise two separate vertical interconnect elements 310a and 310b.

ICs 316a and 316b are positioned above and flip-chip connected to first IC layer 308 through flip-chip joints 312c formed on mounting pads 314c on first IC layer 308 and ICs 316a and 316b. ICs 316a and 316b are also flip-chip connected to vertical interconnect elements 310a and 310b through flip-chip joints 312d formed on mounting pads 314d on ICs 318a and 318b and bonded to conductive areas of vertical interconnect elements 310a and 310b. ICs 318a and 318b sufficiently overhang first IC layer 308 such that ICs 318a and 318b extend over the top surface of vertical interconnect elements 310a and 310b.

Again, it is evident from FIGS. 6 and 7 that since vertical interconnect element 310 is of such narrow dimension, MCM assembly 300 attains an extremely high packaging density. Direct IC connections between first and second IC layers 308 and 316 eliminate the need for space intensive carrier interconnections.

Further, due to the assembly's geometry, differently sized IC layers may be accommodated and further, an unlimited number of separate ICs may be contained on each IC layer, subject only to physical dimensions of the layer itself and the electronic limitations of the circuits themselves.

Finally, as before, each IC layer or IC may be independently based on either digital, analog or passive technology. In this way, different technologies can be combined within a single MCM assembly 300. Further, due to the significantly shorter signal path of flip-chip joints, the present invention also provides a configuration for achieving lower trace impedances and reducing operational cross-talk or electrical noise susceptibility at high frequencies.

Accordingly, MCM assembly 300 provides the user with a highly space efficient, noise resistant, cost efficient, and flexibly designable MCM assembly.

The applicant has determined that the MCM assemblies shown are ideally suited for, but not limited to, application within a "completely in the ear canal" (CIC) type hearing aid, due to their high volumetric efficiency. Such application is especially desirable due to the ability of MCM assemblies 100, 200 and 300 to comprise stacks of different technology-based ICs (e.g. analog, digital, passive, etc.). Finally, the post-fabrication flexibility made possible by the wire bonding of MCM assembly 200 makes the assembly ideally suited for applications which are volume constrained and yet require the ability to customize the interconnect after fabrication of the ICs is completed.

Figure 8:
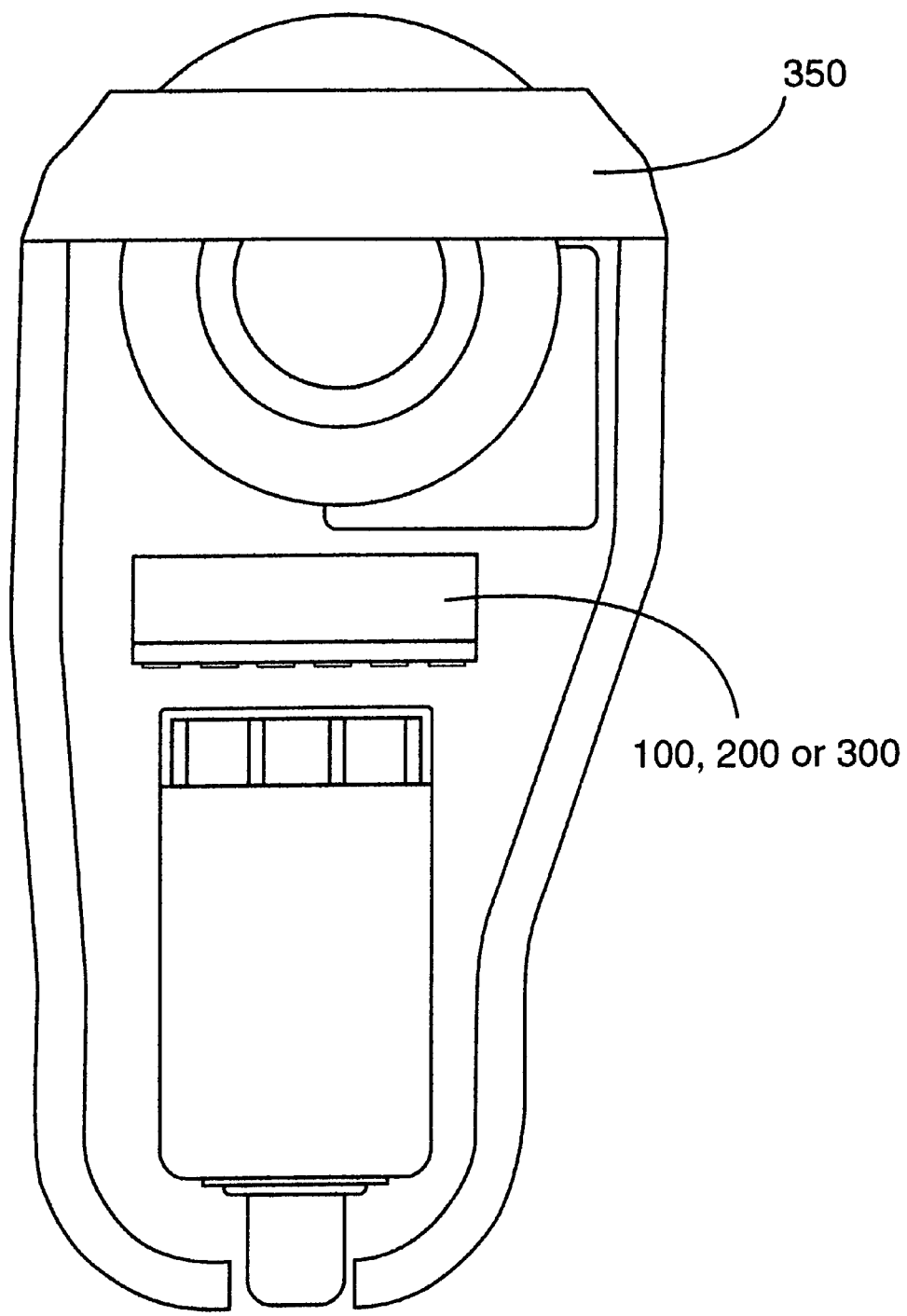
FIG. 8 is a diagrammatic view showing an MCM assembly of the invention located in a hearing aid.

The assembly is typically used as the signal processor of such hearing aids. FIG. 8 shows a typical CIC hearing aid 350 with MCM assembly 100, 200 or 300 located therein.

MCM assemblies often generate a significant amount of heat which must be removed. Temperature gradations also strongly influence the reliability of solder, wire bond, and electrical connection. In many high power applications, an appreciable amount of heat must be dissipated from the assembly which in turn places a practical limit on the density of the circuitry within the MCM. However, when MCM assemblies 100, 200 or 300 are used in low power applications such as hearing aids, heat dissipation does not present any practical limitation.

Preferred Method of Fabrication

It has been determined that the three layer embodiments MCM assemblies 100 and 200 may be efficiently fabricated by connecting the first IC layer 108 and substrate 102 (or 208 and 202) into a first sub-assembly, and the second and third IC layers 116 and 118 (or 216 and 218) into a second sub-assembly. The two sub-assemblies are then interconnected.

The fabrication of the MCM assembly 100 which employs the vertical interconnect element 110 may be as follows. A suitable electrically conductive material (e.g. solder paste or conductive epoxy) is first deposited onto the conductor of substrate 102, in a pattern that corresponds with the mounting pads 114a on first IC layer 108 and conductive areas of vertical interconnect 110. First IC layer 108 is placed into the conductive material, as is vertical interconnect element 110 and these elements are reflow soldered or cured to substrate 102 to complete the joint using an appropriate oven or furnace. Solder paste is applied to the metal solder pads 106 located underneath substrate 102 and reflowed.

A suitable electrically conductive material (e.g. solder paste or conductive epoxy) is deposited onto third IC layer 118 and second IC layer 116 is placed into this material. This combination is reflow soldered or cured to complete electrical-mechanical connections between these two IC layers. This second sub-assembly is then connected to the first sub-assembly as will be described. A suitable electrically conductive material (e.g. solder paste or conductive epoxy) is deposited on the top of vertical interconnect element 110 (part of the first sub-assembly). Second sub-assembly comprising second and third IC layers 116 and 118, is inverted and placed in the conductive material on top of vertical interconnect element 110. Connected first and second sub-assemblies are then reflow soldered or cured to complete the electrical connection from the second sub-assembly to the first sub-assembly through vertical interconnect element 110.

Encapsulant 122 may then be applied under, and in between all layers of the assembly and is cured using an appropriate method until hardened. The final step in the processing is to cut the assembly to a finished form and remove any extra encapsulant and peripheral substrate. This operation may be performed using diamond dicing saws to attain the required final size to tight tolerances.

The fabrication of the MCM assembly 200 which employs wire bonding from second IC layer 216 to substrate 202 is now described. A suitable electrically conductive material (e.g. solder paste or conductive epoxy) is first deposited onto the metal interconnect 204 of substrate 202, in a pattern that corresponds with the mounting pads 214 on first IC layer 208. First IC layer 208 is placed into the conductive material and reflow soldered or cured using a suitable oven or furnace. Solder paste is applied to the metal solder pads 206 underneath substrate 202 and reflowed.

A suitable electrically conductive material (e.g. solder paste or conductive epoxy) is then deposited onto second IC layer 216 integrated circuit and third IC layer 218 is placed into this conductive material. This second sub-assembly is reflow soldered or cured to complete electrical-mechanical connections. This second sub-assembly is attached with adhesive 252 to first IC layer 208 and adhesive 252 is heat cured using a suitable method.

The second sub-assembly is then electrically connected to the first sub-assembly by wire bonding the interconnect points 254 of second layer IC 216 to the pads 250 on the top surface of substrate 202. Since there is an inter-layer electrical connection within each sub-assembly, this wire bonding completes the electrical connection path between all four layers.

As before, encapsulant 222 may be applied and cured using an appropriate method to harden in place and secure all of the elements together. The final step in the processing may be to cut the assembly to a finished form and remove any extra encapsulant and peripheral substrate as previously described.

It has been determined that the two layer embodiment of MCM assembly 300 may be efficiently fabricated by connecting the substrate 302 and vertical interconnect element 310 into a first sub-assembly, and the first and second IC layers 308 and 316 into a second sub-assembly. The two sub-assemblies are then interconnected.

A suitable electrically conductive material (e.g. solder paste or conductive epoxy) is first deposited onto the conductor of substrate 302, in a pattern that corresponds with the conductive areas of the bottom surface of vertical interconnect element 310. Vertical interconnect element 310 is placed into the conductive material and reflow soldered or cured using a suitable oven or furnace. Solder paste is applied to the metal solder pads 306 located underneath substrate 302 and reflowed.

A suitable electrically conductive material (e.g. solder paste or conductive epoxy) is deposited onto second IC layer 316 and first IC layer 308 is placed into this material. This combination is reflow soldered or cured to complete electrical-mechanical connections between these two IC layers to form the second sub-assembly.

This second sub-assembly is then connected to the first sub-assembly by depositing a suitable electrically conductive material (e.g. solder paste or conductive epoxy) on the conductive areas of the top surface of vertical interconnect element 310 (part of the first sub-assembly). Second sub-assembly comprising first and second IC layers 308 and 316, is inverted and placed in the conductive material on top of vertical interconnect element 310. Connected first and second sub-assemblies are then reflow soldered or cured to complete the electrical connection from the second sub-assembly to the first sub-assembly through vertical interconnect element 310.

Encapsulant 322 may then be applied under, and in between all layers of the assembly and may be cured using an appropriate method until hardened. The final step in the processing may be to cut the assembly to a finished form and remove any extra encapsulant and peripheral ceramic. This operation may be performed using diamond dicing saws to attain the required final size to tight tolerances.

As will be apparent to persons skilled in the art, various modifications and adaptations of the structure described above are possible without departure from the present invention, the scope of which is defined in the appended claims.

We claim:

1. A multi-chip module assembly comprising:
   (a) a substrate having a conductive surface facing in a first direction,
   (b) a first integrated circuit (IC) layer having a conductive surface facing in a second direction opposite to said first direction, towards said conductive surface of said substrate, said conductive surface of said first IC layer being electrically connected to said conductive surface of said substrate,
   (c) a second IC layer positioned over said first IC layer, said second IC layer having a conductive surface facing in said first direction, and
   (d) a third IC layer having a conductive surface facing in said second direction, said third IC layer being positioned at least in part over the second IC layer, the conductive surface of said third IC layer being electrically connected to said conductive surface of said second IC layer, wherein said conductive surface of said third IC layer is directly electrically connected to said conductive surface of said substrate.

2. The multi-chip module assembly of claim 1, wherein said conductive surface of said first IC layer is electrically flip-chip connected to said conductive surface of said substrate.

3. The multi-chip module assembly of claim 2, wherein said conductive surface of said third IC layer is electrically flip-chip connected to said conductive surface of said second IC layer.

4. The multi-chip module assembly of claim 1,2, or 3, and including an interconnect member electrically connecting said conductive surface of said third IC layer and said conductive surface of said substrate.

5. The multi-chip module of claim 1,2, or 3, wherein a portion of said conductive surface of said third IC layer is positioned over said conductive surface of said substrate without either of said first and second IC layers being between said portion and said conductive surface of said substrate, and an interconnect member extending between said portion and said conductive surface of said substrate, said interconnect member electrically connecting said portion and said conductive surface of said substrate.

6. The multi-chip module assembly of claim 1,2, or 3, wherein said conductive surface of said third IC layer extends beyond said second IC layer to define an overhanging portion, and an interconnect member extending between said overhanging portion and said conductive surface of said substrate and electrically connecting said overhanging portion and said conductive surface of said substrate.

7. The multi-chip module assembly of claim 1,2, or 3, wherein said conductive surface of said second IC layer is also electrically connected to said conductive surface of said substrate.

8. The multi-chip module assembly of claim 1,2,3 or 7, and including a plurality of conductive wires electrically connecting said conductive surface of said second IC layer and said conductive surface of said substrate.

9. The multi-chip module assembly of claim 1,2,3 or 7 wherein said second IC layer extends beyond said third IC layer to define a portion of said conductive surface of said second IC layer which is not covered by said third IC layer, said portion having electrical contacts therein, and a plurality of conductive wires electrically connecting said contacts and said conductive surface of said substrate.

10. The multi-chip module assembly of claim 1,2,3 or 7 wherein said first, second and third IC layers each comprise at least one integrated circuit.

11. The multi-chip module assembly of claim 1,2,3 or 7 wherein at least one of said first, second and third IC layers comprises a plurality of ICs.

12. The multi-chip module assembly of claim 1,2,3 or 7 including an encapsulant covering said first, second and third IC layers.

13. The multi-chip module assembly of claim 1,2,3 or 7 wherein said second IC layer is adhesively secured to said first IC layer.

14. The multi-chip module assembly of claim 1,2,3 or 7, and being incorporated into a hearing aid and forming a signal processor thereof.

15. A multi-chip module assembly comprising:
   (a) a substrate having a conductive surface facing in a first direction,
   (b) a first integrated circuit (IC) layer positioned over said substrate, having a conductive surface facing in said first direction,
   (c) a second IC layer positioned over said first IC layer, having a conductive surface facing in a second direction opposite to said first direction, said second IC layer extending beyond said first IC layer to define an overhanging portion, the conductive surface of said second IC layer being electrically flip-chip connected to said conductive surface of said first IC layer,
   (d) an interconnect member extending between said overhanging portion and said conductive surface of said substrate, being electrically flip-chip connected to said overhanging portion and electrically flip-chip connected to said conductive surface of said substrate.

16. A multi-chip module assembly comprising:
   (a) a substrate having a conductive surface facing in a first direction,
   (b) a first integrated circuit (IC) layer positioned over said substrate, having a conductive surface facing in said first direction, (c) a second IC layer positioned over said first IC layer, having a conductive surface facing in a second direction opposite to said first direction, wherein a portion of said conductive surface of said second IC layer is positioned over said conductive surface of said substrate without said first IC layer being between said portion and said conductive surface of said substrate, the conductive surface of said second IC layer being electrically flip-chip connected to said conductive surface of said first IC layer, (d) an interconnect member extending between said portion and said conductive surface of said substrate, being electrically flip-chip connected to said portion and electrically flip-chip connected to said conductive surface of said substrate.

17. The multi-chip module assembly of claim 15 or 16 wherein said first and second IC layers each comprise at least one integrated circuit.

18. The multi-chip module assembly of claim 15 or 16 wherein at least one of said first and second IC layers comprises a plurality of ICs.

19. The multi-chip module assembly of claim 15 or 16 and being incorporated into a hearing aid and forming a signal processor thereof.

* * * * *